United States Patent
Michel

(10) Patent No.: US 6,445,561 B1
(45) Date of Patent: Sep. 3, 2002

(54) CIRCUIT ARRANGEMENT, IN PARTICULAR FOR TRIGGERING AN IGNITION END STAGE

(75) Inventor: Hartmut Michel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/462,393

(22) PCT Filed: May 20, 1998

(86) PCT No.: PCT/DE98/01391
§ 371 (c)(1),
(2), (4) Date: Apr. 28, 2000

(87) PCT Pub. No.: WO99/03205
PCT Pub. Date: Jan. 21, 1999

(30) Foreign Application Priority Data

Jul. 8, 1997 (DE) .......................................... 197 29 106
Apr. 16, 1998 (DE) .......................................... 198 16 791

(51) Int. Cl.$^7$ ..................... H01H 47/26; H03K 17/0814
(52) U.S. Cl. ..................... 361/205; 361/170; 361/100; 361/91.7; 257/124; 257/119; 327/439

(58) Field of Search ............................. 361/2, 7, 10, 13, 361/170, 100, 205, 91.2; 307/139, 116, 113; 327/321, 439; 257/107, 119, 124

(56) References Cited

U.S. PATENT DOCUMENTS

| 4,665,459 A | * | 5/1987 | Bynum et al. ................. 361/91 |
| 5,606,278 A | * | 2/1997 | Palara ......................... 327/321 |
| 5,703,520 A | * | 12/1997 | Dikeman et al. ........... 327/439 |
| 5,721,445 A | * | 2/1998 | Sigh et al. ................... 257/369 |

FOREIGN PATENT DOCUMENTS

| DE | 22 38 983 | 2/1974 |
| DE | 31 45 554 | 5/1983 |
| DE | 43 44 126 | 7/1995 |
| EP | 0 715 409 | 6/1996 |
| JP | 59 006622 | 1/1984 |

* cited by examiner

Primary Examiner—Kim Huynh
(74) Attorney, Agent, or Firm—Kenyon & Kenyon

(57) ABSTRACT

A circuit arrangement, in particular for triggering an ignition output stage, having a power switching transistor and a switchable freewheeling circuit or an auxiliary channel. The freewheeling circuit or the auxiliary channel may be constituted by a triggerable four-layer element.

6 Claims, 4 Drawing Sheets

CIRCUIT ARRANGEMENT, IN PARTICULAR FOR TRIGGERING AN IGNITION END STAGE

The present invention relates to a circuit arrangement, in particular for triggering an ignition output stage, having a power switching transistor and at least one switchable freewheeling circuit and/or switchable autonomous auxiliary channel.

BACKGROUND INFORMATION

When inductive loads are shut down, voltage spikes can occur as a result of energy stored in the inductive load. If what is desired is a minimum-loss switch, for example in the case of a clock-timed current controller in the load circuit, it is known that a freewheeling circuit having the lowest possible internal resistance, to which the load current is switched over upon shutdown of the power switch, represents an appropriate solution.

If, on the other hand, what is desired is rapid dissipation of the inductive energy (for example when switching a solenoid valve), or attainment of a high primary voltage for operation of an ignition transformer, then a freewheeling circuit which may optionally be present must be configured in switchable fashion.

German Patent Application No. 4344126 describes for example, a circuit arrangement having a switchable freewheeling circuit, the latter having a freewheeling diode, a freewheeling switching transistor, and a semiconductor component having a defined breakdown voltage. This circuit arrangement is relatively complex, and is expensive to manufacture.

SUMMARY OF THE INVENTION

The circuit arrangement according to present invention has the advantage that it has a simple design and can be obtained, without additional process steps, during the manufacture of the power switching transistor. Because the freewheeling circuit or an autonomous secondary channel is constituted by a triggerable four-layer element, it is possible to create the entire circuit arrangement with a few process steps that can be linked with processing of the power switching transistor. The present invention provides vertical power transistors having autonomous auxiliary channels, whose dielectric strength is comparable to that of the associated power transistor and which can be implemented easily (without additional process steps). In one embodiment of the present invention, provision is made for a thyristor to be monolithically integrated into the power switching transistor, and preferably to be integrated as a lateral component into the edge region of a power switching transistor crystal. As a result, there is only a small additional space requirement for accommodating the thyristor; because of the lateral arrangement of the thyristor in the crystal, a high level of temperature stability can simultaneously be established.

DETAILED DESCRIPTION

Figure 1:
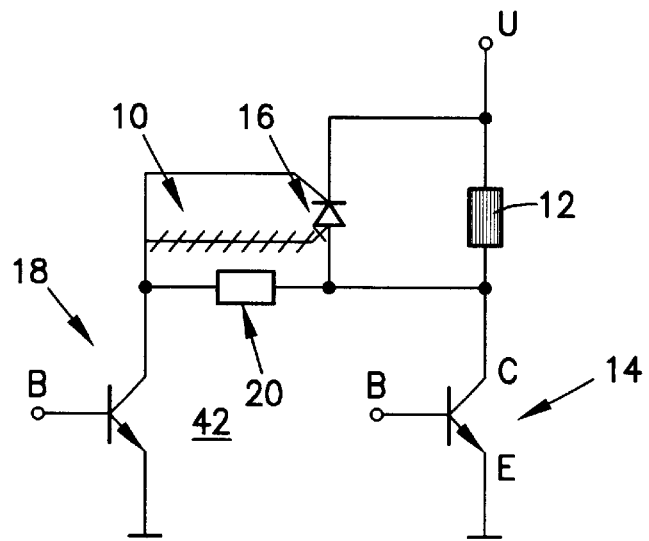
FIG. 1 shows a circuit arrangement of a power switching transistor having a switchable freewheeling circuit.

FIG. 1 depicts a circuit arrangement 10 of an ignition output stage (not depicted in detail). By way of circuit arrangement 10, a primary winding 12 of an ignition coil is connected to a voltage supply U, for example a battery of a motor vehicle. Provided for this purpose is a power switching transistor 14 whose collector is connected to the one terminal of primary winding 12. The emitter of power switching transistor 14 is connected to ground, while the base can be acted upon by a triggering signal.

Also provided is a thyristor 16 whose anode is connected to the collector of power switching transistor 14, and whose cathode is connected to supply voltage U. The control electrode of thyristor 16 is connected to the collector of a switching transistor 18 whose emitter is grounded and whose base can be triggered via a trigger circuit (not depicted). In addition, a resistor 20 is connected between the anode of thyristor 16 and the collector of switching transistor 18.

Figure 2:
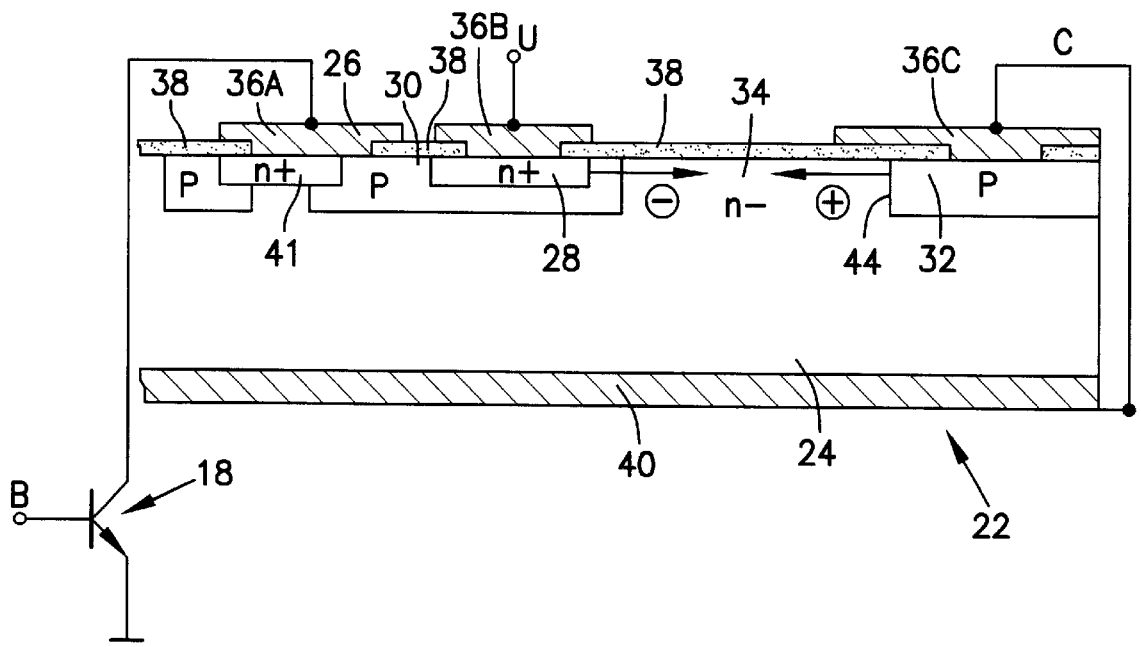
FIG. 2 shows a section through a portion of a semiconductor crystal having the circuit ax arrangement shown in FIG. 1.

FIG. 2 shows the planar layout of thyristor 16 in a schematic section through a planar monolithically integrated component 22. Component 22 also has power switching transistor 14, although the latter is not depicted here in further detail. Component 22 possesses a crystal 24 made of an n⁻-doped material, which simultaneously constitutes the collector of power switching transistor 14. In this n⁻-doped region 24, the individual zones of thyristor 16, which is constituted essentially by a series circuit of three diodes with control terminal 26, are introduced in a manner known per se for the production of zones of specific doping into semiconductor crystals. Thyristor 16 has an n⁺-doped zone 28, connected to voltage supply U, a p-doped zone 30 surrounding zone 28, a p-doped zone 32 connected to collector C of transistor 14, and a zone 34 of n⁻-doped region 24 located between p-doped zones 30 and 32. Also present are usual metal contacts 36 A, B, C for electrical contacting of thyristor 16, and field oxide films 38 for achieving insulation among the individual contacts. Component 22 also has a metallization 40 that is short-circuited to p-doped zone 32 via the collector of power switching transistor 14. Thyristor 16 forms, with switching transistor 18, a switchable freewheeling circuit 42 (FIG. 1) for primary winding 12.

The circuit arrangement shown in FIGS. 1 and 2 performs the following functions:

In normal operation, thyristor 16 is deactivated, so that when power switching transistor 14 is triggered, primary winding 12 is connected to supply voltage U and to ground. To achieve this deactivation of thyristor 16, the potential of p-doped zone 30 is grounded via switching transistor 18, so that any connection between n⁺-doped region 28 and n⁻-doped zone 34 is blocked.

Figure 3:
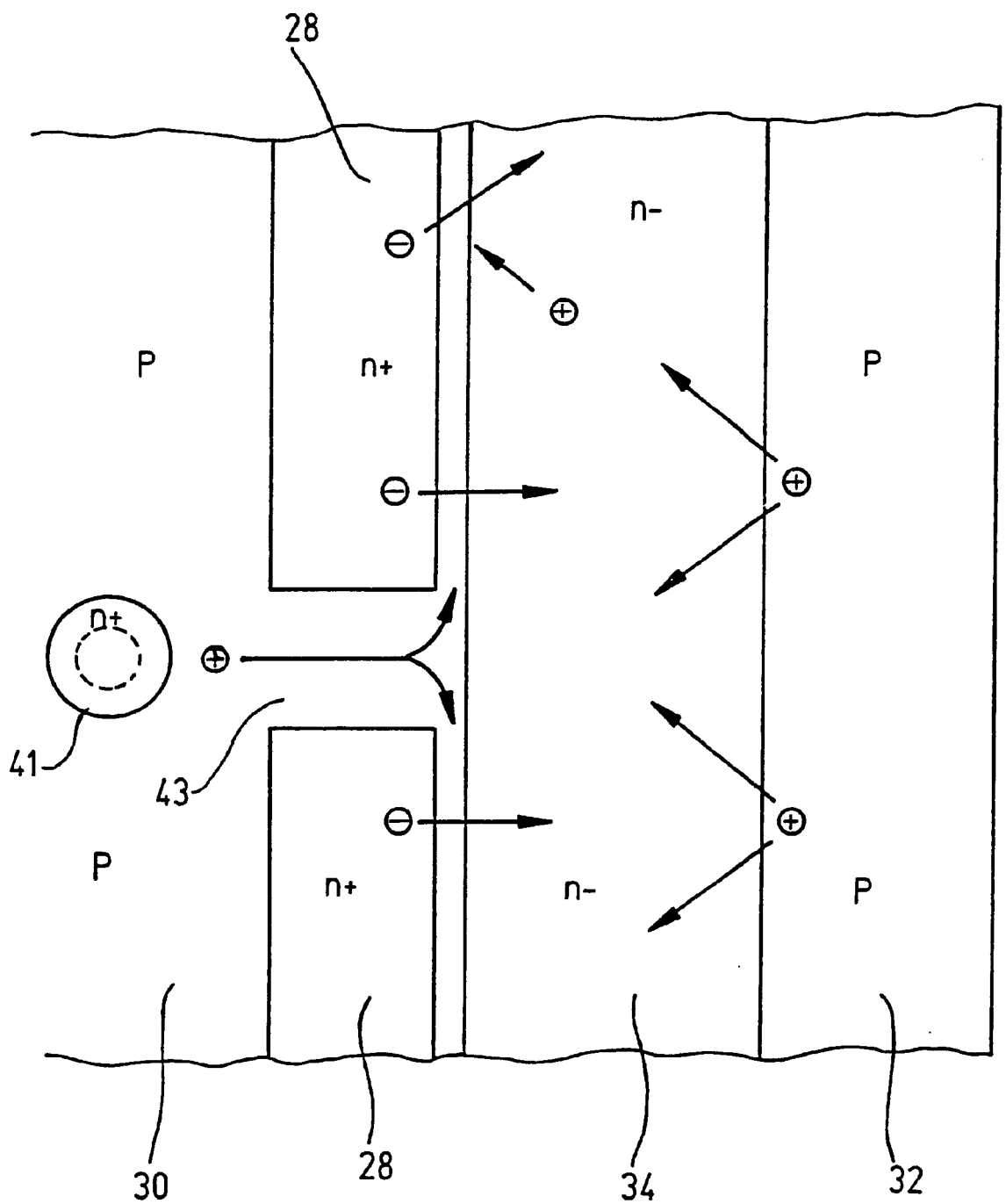
FIG. 3 shows a plan view of the semiconductor crystal illustrated in FIG. 2, without metallizations.

When switching transistor 18 is inhibited, then upon shutdown of power switching transistor 14, the accompanying rise in the collector voltage of power switching transistor 14 means that thyristor 16 can fire via resistor 20. Resistor 20 serves as a current limiting resistor and is configured, for example, as an external resistor or as a so-called "well resistance" within component 22. The well resistance is the quotient of the voltage between metallization 40 and terminal 26, divided by the voltage through an n$^+$-doped zone 41 in p-doped zone 30 (FIG. 3). As a result of the rise in the collector voltage of power switching transistor 14, p-doped zone 30 is pulled via control terminal 26 to a higher voltage than that of n$^+$-doped zone 28 connected to supply voltage U. A firing current is injected as a result, and thyristor 16 thus fires. Injection of the firing current is confined to a small region of p-doped zone 30, so that a path resistance in n$^-$-doped zone 34, from the boundary with field oxide layer 38 to metallization 40, equals several kilohms. The result is that when thyristor 16 fires, even a small injection of electrons into n$^-$-doped zone 34 from n$^+$-doped zone 28, on the order of a few hundred microamperes, is already sufficient to decrease the potential of n$^-$-doped zone 34, as compared to p-doped zone 32, by an amount equivalent to a forward voltage.

In order to make the firing of thyristor 16 even more efficient, provision can be made for n$^+$-doped zone 28 to be split (region 43), and for the ignition current to be injected directly into the boundary region between p-doped zone 30 and n$^-$-doped zone 34 (FIG. 3). After firing, the charge carriers are injected in all directions into p-doped zone 30 and n$^-$-doped zone 34, and the current flow propagates over the entire edge configured as four-layer element 28, 30, 34, 32.

Concurrently with this current flow, a further current flow occurs as a result of the direct electron flow from n$^+$-doped zone 28 (with p-doped zone 30 as base) toward metallization 40. This considerably increases the current-carrying cross section.

Freewheeling circuit 42 (FIG. 1) is activated by the firing of thyristor 16. When power switching transistor 14 is switched on again by a triggering action, the potential of p-doped zone 32 and of n$^-$-doped zone 34 drops, so that thyristor 16 is quenched.

In order to prevent unintended firing of thyristor 16 as a result of barrier layer contact (punch through) between p-doped zone 30 and p-doped zone 32, when the collector voltage of power switching transistor 14 is high, it is possible to form the metal contact 36 C of collector C (shown at the right in FIG. 2) to project beyond edge 44 so that the resulting shielding effect reliably prevents any lateral barrier layer contact from p-doped zone 30 to p-doped zone 32.

For the above-described principle for example, in order to implement a low-loss clock-timed regulation system for the coil current in primary winding 12, when freewheeling is activated via thyristor 16, ignition should be initiated according to the following procedure:
1. Power switching transistor 14 is made conductive, and quenches thyristor 16. Switching transistor 18 is simultaneously made conductive.
2. After the recovery period of thyristor 16, power switching transistor 14 is shut down and ignition at a high voltage level is thereby initiated at collector C.

The material geometry selected for thyristor 16, with an anode short-circuit between metallization 36C and metallization 40 and the option of a cathode short-circuit between n$^+$-doped zone 28 and p-doped zone 30, offers the possibility of shorter recovery periods and higher operating temperatures.

Further optimization possibilities for shutdown of thyristor 16 consist in varying the spacing between p-doped zones 30 and 32. This defines the current gain of the lateral pn$^-$p transistor and the magnitude of the anode short-circuit. At the same time, the inhibition characteristics of the pnp structure within the four active npnp zones of thyristor 16 are influenced.

Circuit arrangement 10 according to the present invention can be used, for example, for a clock-timed ignition output stage in which an average current that has low power dissipation and that can be set via the pulse duty factor is used in the ignition output stage to regulate the energy of an ignition spark.

Circuit arrangement 10 according to the present invention can also be used to maintain, in low-loss fashion and over a longer period following the end of the charging phase, a coil current sufficient for ignition.

Figure 4:
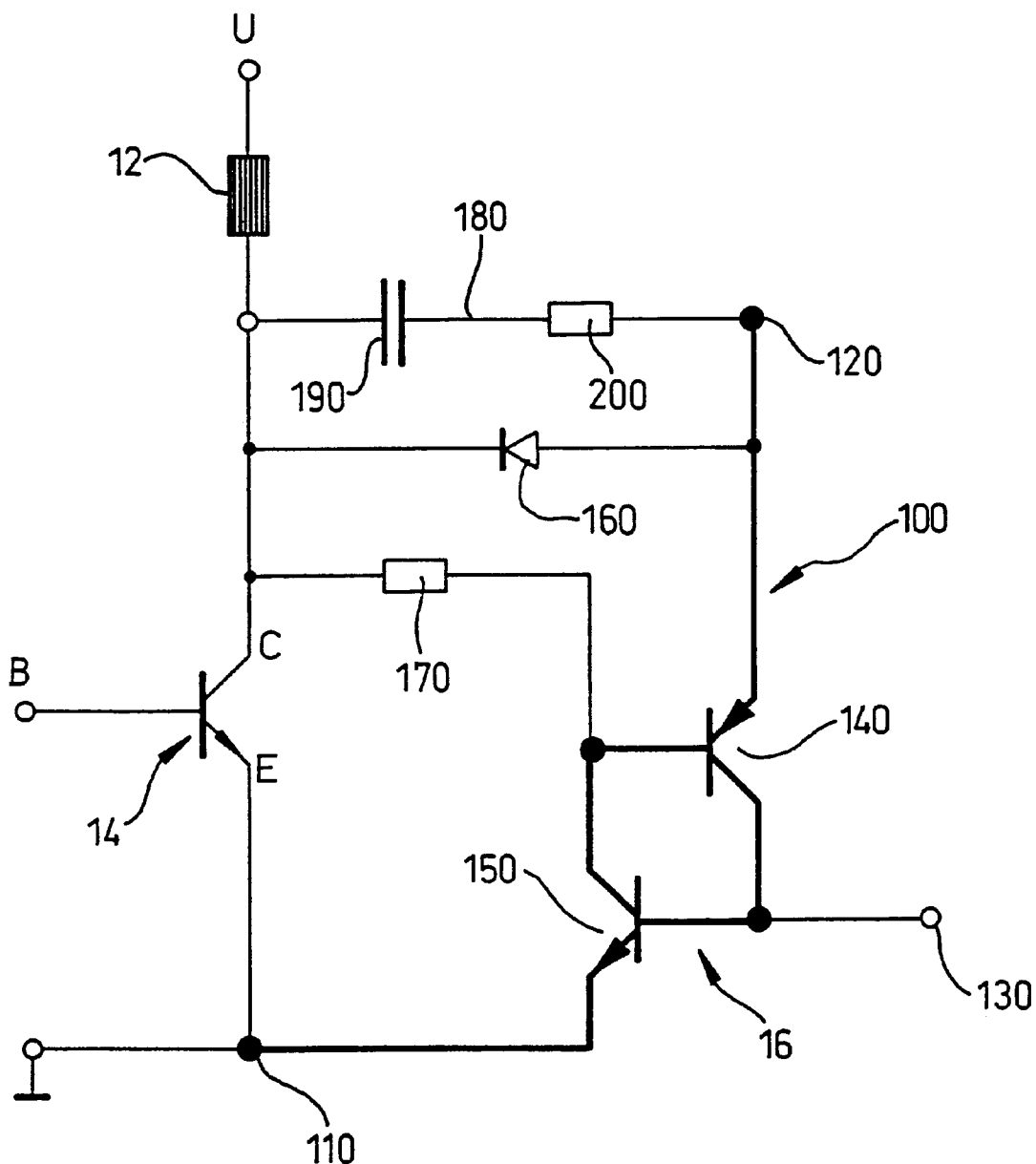
FIG. 4 shows a circuit arrangement having a switchable autonomous auxiliary channel.

FIG. 4 shows an exemplary embodiment of the circuit arrangement according to the present invention having an autonomous auxiliary channel 100. Power switching transistor 14, which can be triggered via its base terminal B, is connected at its collector to an inductive load 12 that in turn is connected to supply voltage U. Autonomous auxiliary channel 100 is constituted, between an auxiliary channel output 110 and an auxiliary channel input 120, by a four-layer element 140, 150, the reference characters 140 and 150 designating the two constituent transistors of the four-layer element. Auxiliary channel output 110 is connected to ground; auxiliary channel input 120 is connected, via a path 180 that is formed by the series circuit made up of a capacitor 190 and a resistor 200, to collector C of power switching transistor 14. A structurally required diode 160 is connected in parallel with path 180. The base of first constituent transistor 140 is connected via a structurally required resistor 170 to the collector of power switching transistor 14. The base of second constituent transistor 150 can be triggered via a control input 130.

Power switching transistor 14 in FIG. 4 constitutes, analogously with the power switching transistor in FIG. 1, a vertical main transistor that is connected at the collector to an inductive load, e.g. to an ignition coil. In the circuit example selected, an autonomous auxiliary channel 100 (marked with bold lines) is provided, representing a current path that can be triggered via control input 130 and is independent of the collector-emitter section of power switching transistor 14. In the circuit example selected, ignition coil 12 serves as the primary coil of a transformer winding for magnetic induction of an ignition spark in the secondary coil. If inductive load 12 is to be connected to ground, in an alternating-voltage context, after a certain period independently of power switching transistor 14, this can be done by way of autonomous auxiliary channel 100 connected in alternative-voltage fashion to the collector of power switching transistor 14, provided it is correspondingly triggered via control input 130. This has the advantage of guaranteeing rapid availability of an auxiliary channel for alternating-voltage grounding of the inductive load, independently of the base triggering of power switching transistor 14. Four-layer element 16 is connected to the ignition coil only capacitatively; in the exemplary embodiment shown, auxiliary channel input 120 is connected via path 180 to the collector of power switching transistor 14. Other wiring layouts for auxiliary channel input 120 can, however, be provided for other applications. The only functional constraint in terms of the switchability of auxiliary channel 100 independently of the collector-emitter section of power switching transistor 14 is represented by the structurally required diode 160: auxiliary channel input 120 must not be operated at a voltage higher than the voltage at collector C of power switching transistor 14. In contrast to the circuit arrangement shown in FIG. 1, in which the current flow occurs from the collector of power switching transistor 14 via thyristor 16 to voltage supply U, in the circuit arrangement shown in FIG. 4, when the auxiliary channel is triggered current flows through the auxiliary channel in the reverse direction, from the collector of power switching transistor 14 via four-layer element 16 to ground, i.e. parallel to the current flow through power switching transistor 14. A further possible application of the autonomous auxiliary channel is represented by delayed activation of the ignition spark, which can be achieved by triggering control input 130 accordingly. Also conceivable are multiple auxiliary channels 100 connected in parallel with one another but triggerable independently of one another, including in combination with a freewheeling circuit as shown in FIG. 1.

Figure 5:
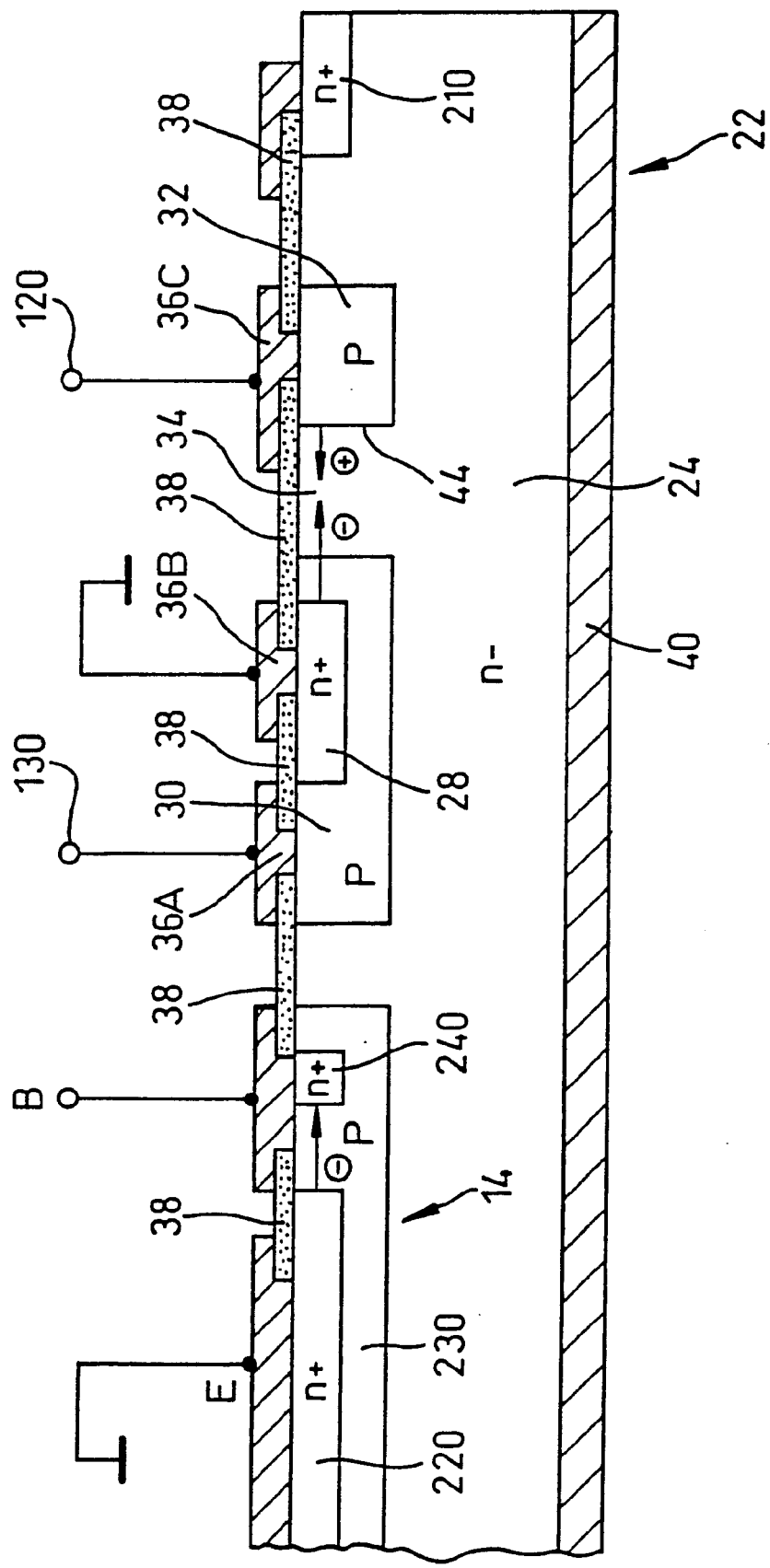
FIG. 5 shows a section, which is similar to the section illustrated in FIG. 2, for the circuit arrangement shown in FIG. 4.

FIG. 5 shows a section through a semiconductor crystal for a circuit arrangement as shown in FIG. 4; the construction of the layer arrangement and the physical events in the semiconductor crystal correspond largely to those in the semiconductor crystal shown in FIG. 2. Identical or similar constituents of the semiconductor crystal are given the same reference characters as in FIG. 2, and are not described again. In contrast to FIG. 2, FIG. 5 also includes a depiction of power switching transistor 14, which continues to the left with its layer structure 220, 230. In this context, the heavily n-doped layer 220 constitutes, via the metallization lying above it, the emitter that is connected to ground. The heavily n-doped layer 220 is embedded into base layer 230, which is p-doped. The base layer can be triggered via base terminal B; a heavily n-doped barrier 240, which shields emitter layer 220 in the direction of the four-layer element, is provided in base layer 230. Also shown in FIG. 5 but not in FIG. 2 is a channel stopper 210, a heavily n-doped layer in the edge region of the semiconductor crystal to suppress electrical breakthroughs in the edge region of the semiconductor crystal. Unlike in FIG. 2, the exemplary embodiment according to FIG. 5 has no well resistance, consequently no heavily n-doped layer 41 and no corresponding "hole" in the p-doping of layer 30. In this instance the four-layer element is laid out as an autonomous auxiliary channel; the heavily n-doped layer 28 is contacted via metallization 36b, which constitutes auxiliary channel output 110 that is connected to ground. Metallization 36c, which makes contact to p-doped layer 32, constitutes auxiliary channel input 120. Control input 130 of autonomous auxiliary channel 100 is constituted by metallization 36a which makes contact to p-doped layer 30. Structurally required resistor 170 is constituted by the lightly n-doped semiconductor region between region 34 and metallization 40. To simplify the depiction, in the equivalent circuit diagram of FIG. 1 the structurally required resistance 170 is not drawn in with a thyristor symbol, although this resistance is in fact present in the circuit arrangement shown in FIG. 2. Structurally required diode 160 is constituted by the p-n transition between layer 32 and semiconductor region 24. A structurally required diode is not depicted in FIG. 1, since in the circuit structure shown in FIG. 2 this structurally required diode is short-circuited by a short-circuit (bonded wire) between anode and collector. Capacitor 190 and resistor 200 are not depicted in FIG. 5; they can be implemented by external components. In the basic version, both components—i.e. the component according to FIG. 2 and one according to FIG. 5—are equipped with five terminals: in FIG. 2 these are terminals B, 40, 36a, 36b, and ground; in FIG. 5 they are terminals B, 40, 130, 120, and ground.

What is common to the components shown in FIG. 5 and FIG. 2 is a lateral four-layer element that is created by diffusing p-doped zones into a lightly n-doped semiconductor base element, and by a heavily n-doped zone, diffused into one of the p-doped zones, as the cathode. Ignition takes place via the transition between the heavily n-doped zone and the p-doped zone surrounding that heavily n-doped zone. In FIG. 5, however, in contrast to FIG. 2, the p-doped emitter is not connected to the collector of the vertical power switching transistor; instead, it constitutes the input 120 of an autonomous auxiliary channel that can be laid out in accordance with the application of the auxiliary channel. If the auxiliary current path created by the auxiliary channel is not self-quenching (as in the present circuit example shown in FIG. 4), but instead the current flow is to be interrupted actively, the emitter of the second constituent transistor 150 can then be passed, in a cascade circuit, through an external or integrated low-voltage transistor. In addition, barrier 240 beneath base terminal B of power switching transistor 14 serves to suppress lateral injection of electrons which may be (undesirable in this context) from emitter layer 220 into lightly n-doped area 24.

What is claimed is:

1. A circuit arrangement, comprising:
   a power switching transistor; and
   at least one switchable electrical auxiliary path arrangement which is configured as at least one of a freewheeling circuit and an electrical auxiliary channel, the electrical auxiliary path arrangement including a triggerable four-layer element;
   wherein the triggerable four-layer element has a metallization, an anode, a cathode and a field plate;
   wherein the circuit arrangement includes a backside;
   wherein a vertical current flow, which is distinguished from a main current flow, flows over the backside to the metallization;
   wherein the anode is at an anode potential;
   wherein the field plate is at the anode potential;
   wherein the field plate has a projection;
   wherein the metallization contacts the anode; and
   wherein the field plate overlaps the anode such that the projection projects over the anode in a direction extending toward the cathode, the projection preventing a punch-through from the cathode to the anode.

2. The circuit arrangement according to claim 1, wherein the triggerable four-layer element is monolithically integrated with the power switching transistor.

3. The circuit arrangement according to claim 1, wherein the triggerable four-layer element includes a first heavily n-doped zone, a first p-doped zone surrounding the first heavily n-doped zone, a second p-doped zone, and a second n-doped zone provided between the first p-doped zone and the second p-doped zone.

4. The circuit arrangement according to claim 3, wherein the first heavily n-doped zone is split so that an ignition current is injectable, via p-doped regions of the first p-doped zone, directly into a boundary region which is provided between the first p-doped zone and the second n-doped zone.

5. The circuit arrangement according to claim 1, wherein the circuit arrangement includes the power switching transistor, and the triggerable four-layer element is integrated as a lateral component into the circuit arrangement.

6. The circuit arrangement according to claim 5, wherein the triggerable four-layer element is integrated as a lateral component into an edge region of the circuit arrangement.

* * * * *

UNITED STATES PATENT AND TRADEMARK OFFICE
CERTIFICATE OF CORRECTION

PATENT NO.    : 6,445,561 B1
DATED         : September 3, 2002
INVENTOR(S)   : Hartmut Michel It is certified that error appears in the above-identified patent and that said Letters Patent is hereby corrected as shown below:

Column 1,
Before line 5, insert -- FIELD OF THE INVENTION --.

Column 2,
Line 35, change "manner known per se" to -- conventional manner --.

Signed and Sealed this

Ninth Day of September, 2003

JAMES E. ROGAN
*Director of the United States Patent and Trademark Office*